US009087849B2

(12) United States Patent
Chen et al.

(10) Patent No.: US 9,087,849 B2
(45) Date of Patent: Jul. 21, 2015

(54) ELECTROSTATIC DISCHARGE PROTECTION DEVICES

(71) Applicant: IMEC VZW, Leuven (BE)

(72) Inventors: Shih-Hung Chen, Leuven (BE); Dimitri Linten, Boortmeerbeek (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/478,817

(22) Filed: Sep. 5, 2014

(65) Prior Publication Data

US 2015/0069529 A1    Mar. 12, 2015

(30) Foreign Application Priority Data

Sep. 6, 2013  (EP) .................................... 13183428

(51) Int. Cl.
*H01L 27/02* (2006.01)
*H01L 23/00* (2006.01)
*H01L 29/78* (2006.01)

(52) U.S. Cl.
CPC .............. *H01L 23/564* (2013.01); *H01L 29/78* (2013.01)

(58) Field of Classification Search
CPC .... H01L 27/0248; H01L 23/564; H01L 29/78
See application file for complete search history.

(56) References Cited

U.S. PATENT DOCUMENTS

| 5,465,189 A | 11/1995 | Polgreen et al. |
| 8,455,947 B2 * | 6/2013 | Shrivastava et al. .......... 257/336 |
| 2007/0262386 A1 | 11/2007 | Gossner et al. |
| 2009/0309167 A1 | 12/2009 | Russ et al. |

OTHER PUBLICATIONS

European Search Report dated Dec. 12, 2013 in European Patent Application No. 13183428.5.
Griffoni et al., "Next Generation Bulk FinFET Devices and Their Benefits for EDS Robustness," *IEEE EOS/ESD Symposium*, (31), 10 pages (2009).

* cited by examiner

*Primary Examiner* — Roy Potter
*Assistant Examiner* — Paul Patton
(74) *Attorney, Agent, or Firm* — Knobbe, Martens, Olson & Bear LLP

(57) ABSTRACT

The disclosed technology generally relates to electrostatic discharge protection devices that protect circuits from transient electrical events and more particularly to low-voltage triggered silicon-controlled rectifier devices implemented using a bulk fin field-effect transistor technology. In one aspect, an electrostatic discharge protection device comprises a low-voltage triggered silicon-controlled rectifier having an embedded grounded-gate n-channel metal oxide semiconductor structure implemented as a bulk fin field-effect transistor having a plurality of fin structures. The fin structures direct current from an avalanche zone to a gate formed over the fin structure. The electrostatic discharge protection device has a higher trigger current and a lower leakage current than a similar device having a planar embedded grounded-gate n-channel metal oxide semiconductor structure because the current flow is restricted by the fin structures.

14 Claims, 4 Drawing Sheets

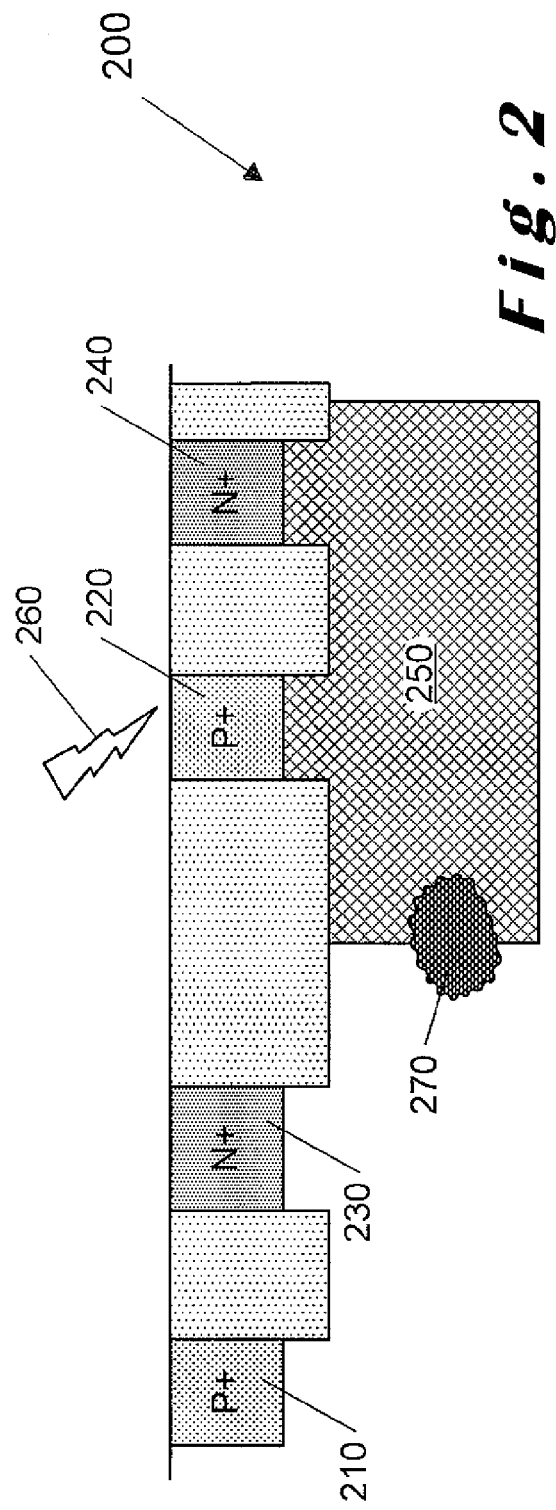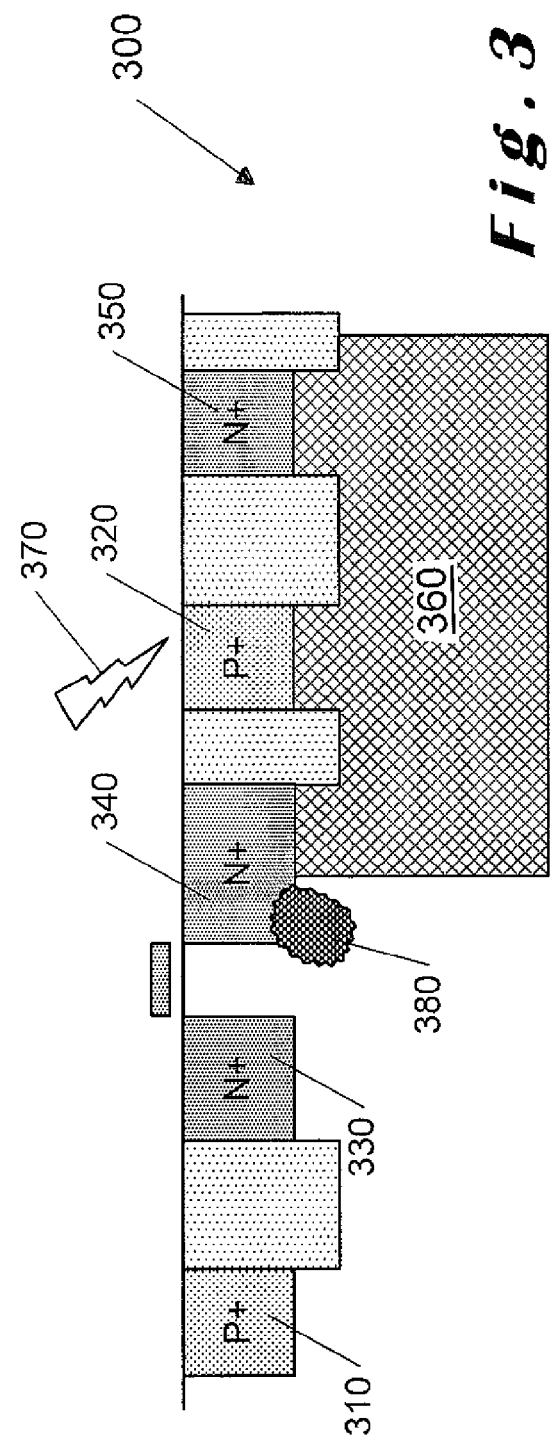

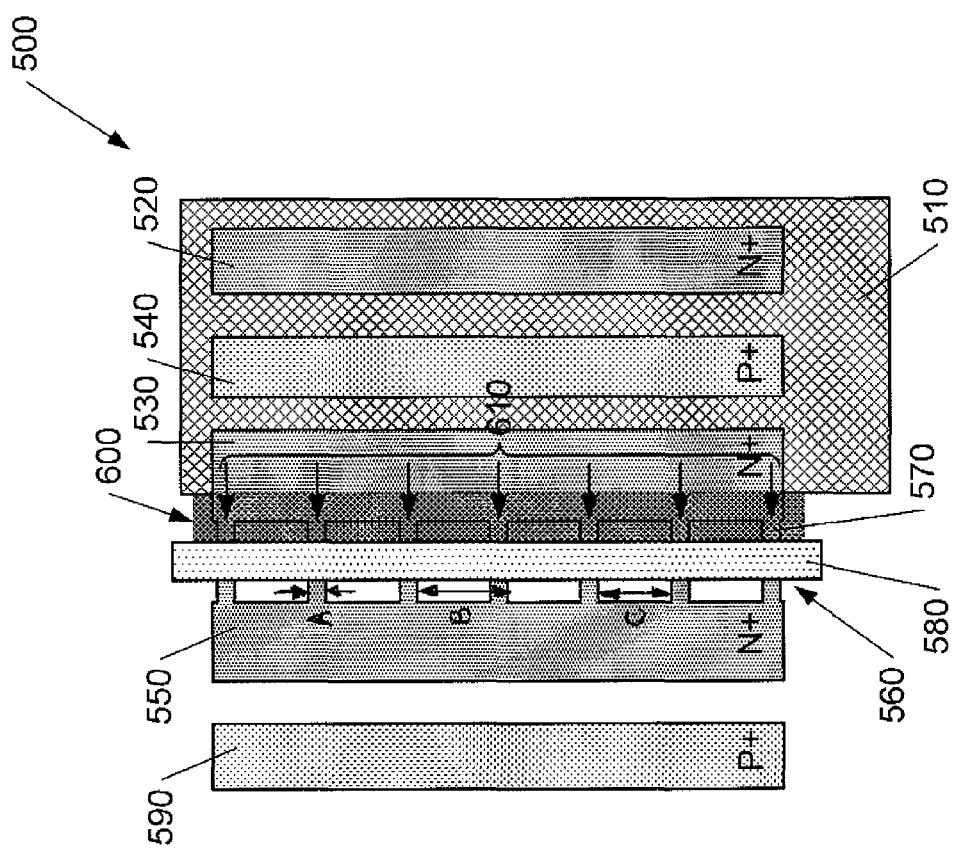
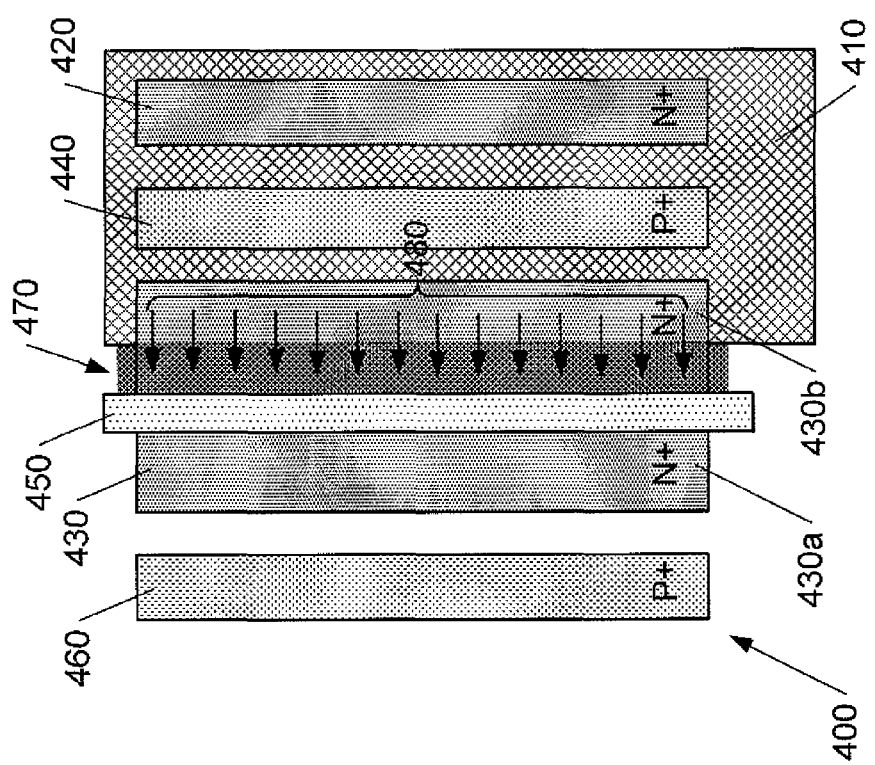
Fig. 5
Fig. 4

ELECTROSTATIC DISCHARGE PROTECTION DEVICES

CROSS-REFERENCE TO RELATED APPLICATIONS

This application claims foreign priority to European patent application EP 13183428.5, filed on Sep. 6, 2013, the content of which is incorporated by reference herein in its entirety.

BACKGROUND OF THE INVENTION

1. Field of the Invention

The disclosed technology generally relates to electrostatic discharge protection devices that protect circuits from transient electrical events and more particularly to low-voltage triggered silicon-controlled rectifier devices implemented using a bulk fin field-effect transistor technology.

2. Description of the Related Technology

Certain electronic systems can be exposed to transient electrical events that last a relatively short duration and have rapidly changing voltages and/or currents. Transient electrical events can include, for example, electrostatic discharge (ESD) events arising from the abrupt release of charge from an object or a person to an electronic system. Such transient electrical events can potentially lead to core circuits being damaged, resulting in gate oxide punch-through, junction damage, metal damage, and surface charge accumulation, among others. Moreover, transient electrical events can induce latch-up (in other words, inadvertent creation of a low-impedance path), thereby disrupting the functions of and potentially causing permanent damage to the IC.

To protect the ICs inside electronic systems, some electronic systems incorporate electrostatic discharge (ESD) protection devices for protecting various structures and circuits during manufacturing and/or during operation of the electronic systems. ESD protection devices can be designed to be triggered, that is, switched from an 'off' state to an 'on' state, when they are exposed to an ESD event, such as an abnormal external electrical pulse. Under normal operation, these protection devices are normally returned to their normal 'off' state when the abnormal external pulse has subsided, and should be kept in an 'off' or non-operational state during normal operation of the semiconductor device and its associated circuit.

Some silicon-controlled rectifier (SCR) devices provide protection against electrostatic discharge due their superior area efficiency which provides electrostatic discharge robustness. However, some SCR devices have relatively high trigger voltages. Moreover, some SCR device suffer from the risk of mis-triggering into an 'on' state, followed by a transition into a latch-up state with high leakage currents, even under normal circuit operating conditions. The relatively high trigger voltages and the risk of latch-up can be prohibitive in certain applications, such as advanced complementary metal oxide semiconductor (CMOS) and power-rail electrostatic discharge protection technologies.

Low-voltage triggered silicon-controlled rectifier (LVT SCR) devices are sometimes used for their reduced trigger voltages. Such devices have been implemented, for example, in sub-micrometer CMOS integrated circuit products, for example, as a grounded-gate n-channel CMOS device. While some low-voltage triggered silicon-controlled rectifiers have relatively lower trigger voltages, they still may still suffer from the risk of latch-up during normal operational conditions of the circuit they are intended to protect.

U.S. Pat. No. 8,455,947 describes a fin field-effect transistor (FinFET) type device which can be used for electrostatic discharge protection. The device comprises a bipolar device portion and an n-channel metal oxide semiconductor device portion, the two portions being connected to one another. Each of the bipolar device portions and n-channel metal oxide semiconductor device portions comprises first, second and third doped regions. Each n-channel metal oxide semiconductor device portion is directly coupled to the bipolar device portion via the second doped portion of the bipolar device portion and the differently doped region of the n-channel metal oxide semiconductor device portion. A gate is formed which is effectively wrapped around the second doped region of the n-channel metal oxide semiconductor device portion. The resulting configuration has the bipolar device portion and the n-channel metal oxide semiconductor device portion that have different orientations, which can be difficult to implement in current state of the art bulk FinFET technology.

US 2009/0309167 describes the use of electrostatic protection devices in a two-stage electronic device in which a first stage and a second stage are respectively connected to an input line and an output line as well to one another, and, to primary and secondary voltage supplies. The ESD protection devices are provided at the input and the output of the electronic device and are connected between input and output lines and each of the primary and secondary supplies. The ESD protection devices can be configured as either a metal oxide semiconductor device or as a fin-based bipolar device where the bipolar device forms a silicon-controlled rectifier device.

However, the disclosed ESD protection devices have an extra doped epitaxial layer to provide electrostatic discharge protection. In addition, such devices are not low voltage and do not address the issue of latch-up and latch-up immunity.

US 2007/0262386 describes an electrostatic discharge protection device in which a plurality of electrostatic discharge (ESD) protection elements are connected in parallel, wherein each ESD protection element includes a fin structure. At least one gate region is formed on or above the fin structures which is connected to a gate control circuit. The gate control circuit acts as a trigger for the electrostatic discharge protection device. The fin structures may be implemented in multi-gate field-effect transistor technology and each fin may comprise a stacked silicon-controlled rectifier (SCR) structure in which a plurality of SCR elements are provided with no isolation structures, for example, shallow trench isolation structures, between the SCR elements.

In this case, the gate control circuits are connected in parallel with an element of an electrical circuit that is to be protected. The detection of an electrostatic discharge event changes the state of the gate to which the gate control circuit is connected so that the current generated by the event can be dissipated. Whilst a SCR structure is provided, the trigger voltage is determined by the gate control circuit and not by the SCR structure itself.

Based on the foregoing references discussed above, there remains a need for low-voltage triggered silicon-controlled rectifiers that have relatively high trigger voltages with increased immunity to latch-up during normal operating conditions. Moreover, none of the foregoing references disclose an implementation of an electrostatic discharge protection device in bulk fin field-effect transistor technology.

In addition, with the trend towards sub-20nm node technology and the associated modifications required in processes to be able to shrink the footprint of bulk fin field-effect transistor type devices, fin widths need to be considered as it has been shown that they are important parameters relating to electrostatic discharge characteristics as discussed by A. Griffoni et al. in "Next generation bulk FinFET devices and their benefits for ESD robustness", EOS/ESD Symposium, 2009, pages 59 to 68. For example, all current produced due to electrostatic discharge needs to be discharged through the fins, which due to their small sizes, tend to induce localised 'hot spots' which results in a deterioration in robustness against electrostatic discharge.

SUMMARY OF CERTAIN INVENTIVE ASPECTS

It is an object of the present disclosure to provide an electrostatic discharge protection device which operates on a higher trigger current than conventional low voltage trigger electrostatic discharge protection devices whilst substantially reducing the risk of mis-triggering and subsequent transition to a latch-up state during normal operating conditions of the electronic device and/or circuit which it is intended to protect.

In one aspect of the present disclosure, there is provided an electrostatic discharge protection device comprising a low-voltage triggered silicon-controlled rectifier including a grounded-gate metal oxide semiconductor structure having a gate and an avalanche zone in the locality of the gate, characterised in that the low-voltage triggered silicon-controlled rectifier comprises a bulk fin-based transistor structure including a plurality of shallow trench isolation structures.

An advantage of the combination of the low-voltage triggered silicon-controlled rectifier and a fin based transistor structure is that, whilst low voltages are provided which keep the current/voltage characteristic within an electrostatic discharge protection design window, high trigger currents can be implemented whilst substantially reducing the risk of latch-up during normal operating conditions.

In some embodiments, the bulk fin-based transistor structure comprises a plurality of fin elements extending under the gate.

In some embodiments, the pitch of fin elements may be in the range of between 40 nm and 200 nm. Preferably, the pitch of the fin elements is 200 nm.

In some embodiments, each fin element may have a width in the range of between 7 nm and 45 nm, preferably between 10 nm and 40 nm, and most preferably a width of 20 nm.

Preferably, the grounded-gate metal oxide semiconductor structure comprises a grounded-gate n-channel metal oxide semiconductor structure.

In another aspect, an apparatus for protection against transient electrical events includes a p-type substrate and an n-type well formed in the p-type substrate. The apparatus additionally includes a first p+ region formed in the p-type substrate, a second p+ region formed in the n-type well, and a first n+ region formed in the n-type well. The apparatus additionally includes a metal oxide semiconductor (MOS) structure laterally interposed between the first and second p+ regions. The MOS structure includes an n+ source region and an n+ drain region extending in a first lateral direction, where the n+ source region and the n+ drain region are interposed by a channel region having a plurality of fin-shaped channel strips. Each fin-shaped channel strip extends in a second lateral direction crossing the first direction to connect the n+ source and n+ drain regions while separating two dielectric isolation regions in the first lateral direction, such that the channel region comprises a plurality of fin-shaped channel strips and dielectric isolation regions alternating in the first lateral direction. The MOS structure additionally includes a gate extending in the first lateral direction and formed over portions of the fin-shaped strips and the dielectric isolation regions. The n+ drain region is interposed between the gate and the second p+ region and formed at a boundary region between the p-type substrate and the n-type well such that a portion of the n+ drain region is formed in the p-type substrate while a remaining portion of the n+ drain region is formed in the n-type well.

In some embodiments, the n+ drain region and the second p+ region are substantially parallel to each other and co-extend in the first lateral direction. The n+ drain region and the second p+ region have substantially the same lengths and co-terminate in the first lateral direction.

In some other embodiments, the n+ source region is interposed between the gate and the first p+ region, and the n+ source region and the first p+ region are substantially parallel to each other and co-extend in the first lateral direction. The n+ source region and the first p+ region have substantially the same lengths and co-terminate in the first lateral direction.

BRIEF DESCRIPTION OF THE DRAWINGS

For a better understanding of the present disclosure, reference will now be made, by way of example, to the accompanying drawings in which:

FIG. 2 illustrates a schematic cross-section view of a silicon-controlled rectifier;

FIG. 3 illustrates a schematic cross-section view of a low voltage trigger silicon-controlled rectifier;

FIG. 4 is a schematic illustration of a top view of a low-voltage triggered silicon-controlled rectifier low-voltage triggered silicon-controlled rectifier having a planar embedded grounded-gate n-channel metal oxide semiconductor device;

FIG. 5 is a schematic illustration of a top view of a low-voltage triggered silicon-controlled rectifier having a fin field-effect transistor embedded grounded-gate n-channel metal oxide semiconductor device in accordance with the present disclosure.

DETAILED DESCRIPTION OF CERTAIN ILLUSTRATIVE EMBODIMENTS

Figure 1:
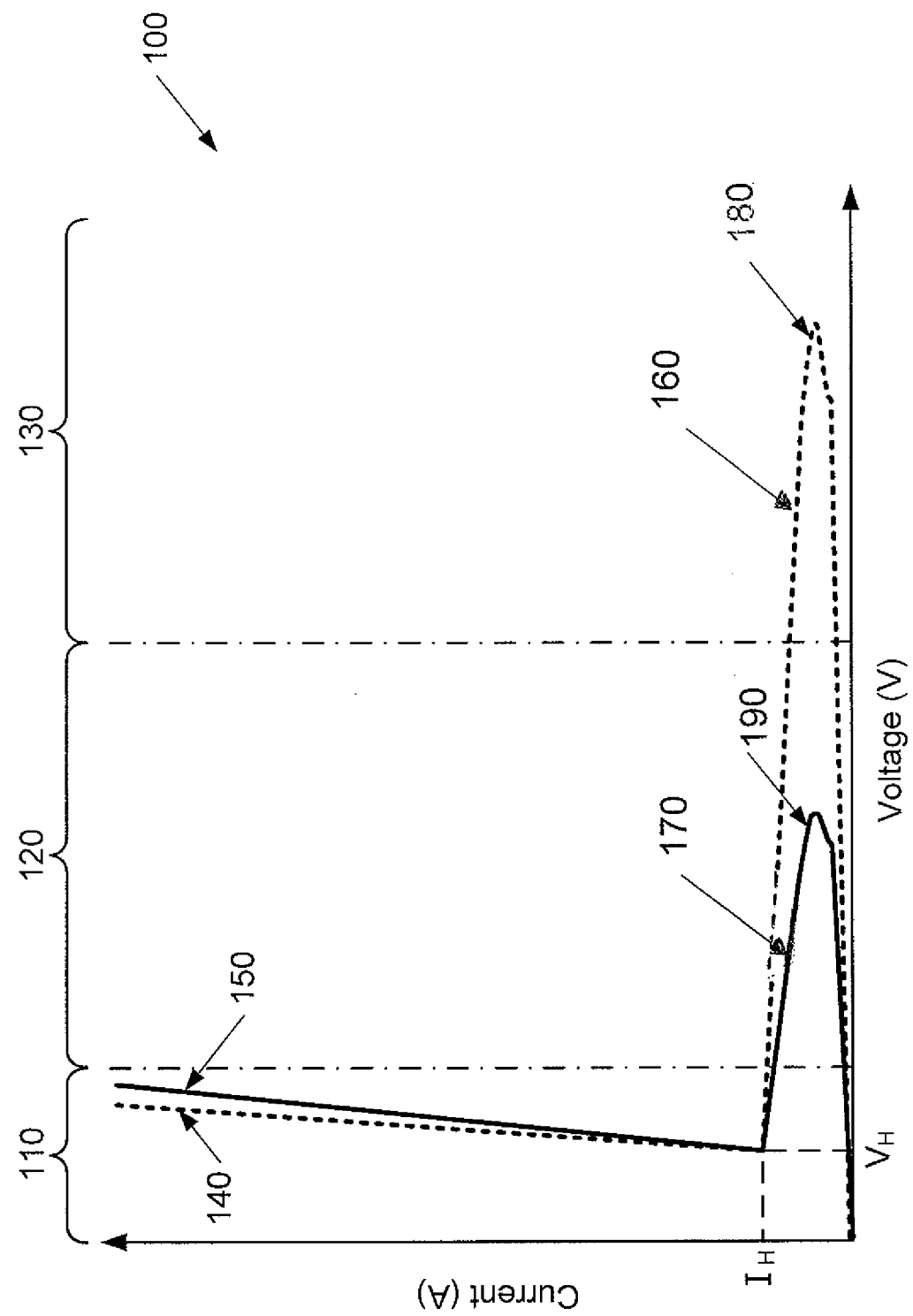
FIG. 1 is a schematic illustration of a current/voltage characteristic for silicon-controlled rectifiers and for low voltage trigger silicon-controlled rectifiers.

The present disclosure will be described with respect to particular embodiments and with reference to certain drawings but the disclosure is not limited thereto.

The drawings described are only schematic and are non-limiting. In the drawings, the size of some of the elements may be exaggerated and not drawn on scale for illustrative purposes.

Grounded-gate n-channel metal oxide semiconductor (GGNMOS) structures or devices can be used for electrostatic discharge (ESD) protection of integrated circuit (IC) devices. In a GGNMOS structure, a gate, a source and a body are electrically connected to one another and to ground. If the ESD protection is applied to an input/output (I/O) pad, for example, the drain of the GGNMOS structure is connected to the I/O pad to form a parasitic NPN bipolar junction transistor (BJT) in which the n-type doped drain serves as the collector, the n-type doped source serves as the emitter, and the p-type doped substrate serves as the base. The parasitic resistance between emitter and base terminals is defined by the finite conductivity of the p-type doped substrate.

In the example given above, when an ESD event (e.g., a positive transient voltage) appears at the I/O pad connected to the drain, the collector-base junction (i.e., the drain-body junction) of the parasitic NPN structure becomes reverse-biased and enters an avalanche breakdown mode at a sufficiently high reverse bias voltage. Once in the avalanche breakdown mode, positive current flows from the base to the ground, thereby inducing a positive voltage to appear across the base-emitter junction (i.e., the body-source junction). This positive voltage forward-biases the base-emitter junction, thereby turning on the parasitic NPN bipolar transistor.

In the disclosed technology, the positive current flowing through the forward-biased base-emitter junction is localized within a fin field-effect transistor (FinFET) structure, thereby increasing the trigger current and reducing the possibility of mis-triggering and increasing immunity against latch-up.

The term "latch-up," as used herein, refers to a phenomenon which occurs within a parasitic device or system generated within a complementary metal oxide semiconductor (CMOS) structure which results in unwanted current flow through at least a portion of the CMOS structure. For example, in a LVT SCR device including a GGNMOS structure similar to that described above, two back-to-back BJTs are formed during a latch-up. An NPN BJT current path may be first created due to a forward-biased base-emitter junction of an NPN BJT. The resulting current flow induces a voltage drop to create a forward conducting PNP BJT. In effect, a PNPN path is created which maintains the device or circuit in a latch-up state at normal operating voltages.

The term "latch-up immunity" as used herein refers to the immunity of a CMOS structure to turning on of the parasitic devices and to the generation of unwanted current flow in the parasitic devices of the structure.

The terms "trigger voltage" and "trigger current" as used herein respectively refer to the voltage and current at which an ESD protection device triggers, that is, switches from an 'off' state to an 'on' state. Trigger current can be a direct measure of latch-up performance, that is, the higher the trigger current, the better the latch-up performance.

The term "trigger point" as used herein refers to a point in a current/voltage characteristic which corresponds to the trigger voltage and trigger current.

The terms "holding voltage" and "holding current" as used herein respectively refer to voltage and current required to maintain a circuit in its 'ON' state.

The term "fin width" as used herein refers to the width of the fin, as indicated in FIG. 5 by "A." The term "pitch" as used herein refers to the distance between a particular point on one fin and a corresponding point on an adjacent fin, as indicated in FIG. 5 by "B." The term "spacing" as used herein refers to the distance between fins and is equivalent to the distance determined as the pitch minus the fin width, as indicated in FIG. 5 by "C."

FIG. 1 shows a graph 100 which represents current/voltage characteristics of a conventional silicon-controlled rectifier (SCR) device in comparison with current/voltage characteristics of a conventional low-voltage trigger SCR (LVT SCR). For illustrative purposes only, the graph 100 is divided into three zones or regions 110, 120, 130 in accordance with increasing voltage. Zone or region 110 can represent a latch-up risk region; zone or region 120 can represent an electrostatic discharge (ESD) protection design window region; and zone or region 130 can represent a gate oxide failure region. The current/voltage characteristic for a conventional SCR device is indicated by lines 140, 160 and that for a conventional LVT SCR device is indicated by lines 150, 170. In addition, a holding voltage $V_H$ and a corresponding holding current $I_H$ for the conventional SCR and LVT SCR devices are also shown.

For a conventional SCR device, line 140 indicates the current increase at low voltages due to latch-up, and line 160 indicates the saturation characteristics for such a device with a trigger point 180. The trigger point 180 represents the voltage at which the SCR device is turned on for ESD protection.

Similarly, for a conventional LVT SCR device, line 150 indicates the current increase at low voltages, and line 170 represents the saturation characteristics with a trigger point 190. The trigger point 190 represents the voltage at which the LVT SCR device is turned on for ESD protection.

The interface between zones or regions 110 and 120 corresponds to the operating voltage (VDD) of the device, and the interface between zones or regions 120 and 130 corresponds to the failure voltage of the device.

As shown, the trigger point 180 of a conventional SCR device, which can typically be around 15V, is considerably larger than the trigger point 190 of a conventional LVT SCR device, which can typically be around 5V. The trigger voltage of the SCR device that is around 15V can be sufficient to induce gate oxide failure (in zone or region 130), thereby causing serious damage to a device which such a device is intended to protect. On the other hand, the trigger voltage of the LVT SCR device that is around 5V can remain within the zone or region 120 and can therefore provide some protection for the device which it is intended to protect.

In FIG. 2, an SCR device 200 is shown which comprises p+ doped regions 210, 220 and n+ doped regions 230, 240. The n+ doped region 230 and the p+ doped region 210 are formed in a p-type material, for example, a suitably doped substrate (not shown). The n+ doped region 240 and p+ doped region 220 are formed in an n-well 250. The n-well 250 is formed in the p-type material or substrate. As illustrated, an ESD event 260 can generate a high bulk-drain or base-collector voltage as is shown schematically at 270 for the device 200.

In FIG. 3, a LVT SCR device 300 is shown which comprises p+ doped regions 310, 320 and n+ doped regions 330, 340, 350. The n+ doped region 330, the p+ doped region 310 and a part of the n+ doped region 340 are formed in a p-type material or substrate (not shown). The n+ doped region 350, the p+ doped region 320 and part of the n+ doped region 340 are formed in an n-well 360. The n-well 360 is formed in the p-type material or substrate. As illustrated, an ESD event 370 can generate a low bulk-drain or base-collector voltage as is shown schematically at 380 for the device 300.

In accordance with the present disclosure, as will be described in detail in reference to FIG. 5, an embedded GGNMOS structure with bulk fin field-effect transistor (FinFET) is applied to a LVT SCR device to increase its trigger current and thereby enhance its immunity to latch-up. This has the advantage that the current flowing through the device can be re-distributed and restrained locally within the FinFET configuration as will be described in more detail below.

By way of comparison, an LVT SCR device 400 including a planar embedded GGNMOS device is shown in FIG. 4. The device 400 comprises a first region 410 having n+ doped areas 420, 430 and a p+ doped area 440. The first region 410 comprises an n-well which is formed in a p-type material or substrate (not shown). A gate 450 is formed on a p-type material or substrate (not shown) which effectively separates the n+ doped area 430 into two sub-areas 430a, 430b. Another p+ doped area 460 is also provided.

Although the n+ doped area 430 is described as being a single n+ doped area which is effectively partitioned by the gate 450, it will be appreciated that each of the sub-areas 430a, 430b may comprise separate areas with the gate 450 being located between the two separate areas.

It will readily be understood that p+ doped area 460, n+ doped sub-area 430a and a part of n+ doped sub-area 430b are formed in the p-type material or substrate (not shown), and n+ doped area 420, p+ doped area 440 and a part of n+ doped sub-area 430b are formed in the n-well or region 410.

In the device 400, an anode is defined by the n+ doped area 420 and the p+ doped area 440, and a cathode is defined by the n+ doped area 430a and the p+ doped area 460.

It will readily be understood that, due to the high doping of the areas 420, 430, 440, 460, the LVT SCR device 400 would normally be implemented using a plurality of shallow trench isolation (STI) structures or zones for isolating the highly doped areas from the structure in which they are formed. In the case of p+ doped area 460, n+ doped sub-area 430a and part of n+ doped sub-area 430b, STI structures or zones (not shown) can be provided to isolate each of these areas and sub-areas from the p-type material or substrate. Similarly, for n+ doped area 420, p+ doped area 440 and part of n+ doped sub-area 430b, STI structures or zones (not shown) can be provided to isolate each of these areas from the n-well or first region 410 in which they are formed.

Although the STI structures or zones are not shown in FIG. 4, it would be apparent to a person skilled in the art where they would be located to provide the isolation required for operation of the LVT SCR device 400.

When an ESD event occurs, an avalanche zone 470 is created in the n+ doped sub-area 430b of the n+ doped area 430 adjacent the gate 450 when avalanche breakdown occurs to generate current flow towards the gate 450 through sub-area 430b.

In the embodiment described, the device 400 has a total device width of 40 μm in a direction which corresponds with the gate width, with an anode to cathode distance of 840 nm.

A LVT SCR device 500 in accordance with some embodiments of the present disclosure is shown in FIG. 5. Similar to the device 400 described above with respect to FIG. 4, the device 500 includes a first region 510 having an n+ doped area 520, a p+ doped area 540 and a part of an n+ doped area 530. The first region 510 comprises an n-well, which is formed in a p-type material or substrate (not shown). The n+ doped area 530 is connected to another n+ doped area 550 by means of a FinFET structure 560 comprising a plurality of fins 570 (only one of which is labelled for clarity) as shown. The device additionally includes a gate 580 extending in a first lateral direction and formed over the plurality of fins 570 of the FinFET structure 560. In some embodiments, the fins 570 are formed by recessing the adjacent substrate material such that the top surfaces of the fins 570 are substantially co-planar with the main surface of the substrate. That is, the fins 570 do not protrude substantially above the main surface of the substrate according to these embodiments. The device further includes a separate p+ doped area 590 formed within the p-type material or substrate. The n+ doped area 550, the p+ doped area 590 and a part of n+ doped area 530 are formed in the p-type material or substrate (not shown).

In some embodiments, the p+ doped area 540 and the n+ doped area 530 co-extend in a first lateral direction (lengthwise direction) and are substantially parallel to each other. Furthermore, the spacing between edges of the n+ doped area 530 and the p+ doped area 540 that are facing each other is substantially equal throughout the length of the spacing in the first lateral direction. The lengths of the p+ doped area 540 and of the adjacent n+ doped area 530 in the first lateral direction are substantially similar or equal. However, in other embodiments the lengths of the p+ doped area 540 and of the adjacent n+ doped area 530 are substantially different.

In the illustrated embodiment, the p+ doped area 590 is formed adjacent to the n+ doped area 550. The p+ doped area 590 and the n+ doped area 550 co-extend in the first lateral direction (lengthwise direction) and are substantially parallel to each other. Furthermore, the spacing between edges of the p+ doped area 590 and the n+ doped area 550 that are facing each other is substantially equal throughout the length of the spacing in the first lateral direction. The lengths of the p+ doped area 590 and the n+ doped area 550 in the first lateral direction are substantially similar or equal. Whilst this is a preferred topology, it should be noted that it is possible to have variations on this without substantially affecting the performance of the LVT SCR device in accordance with the present disclosure. This also applies to n+ doped area 520 in relation to p+ doped area 540.

Still referring to FIG. 5, in some embodiments, an anode includes the n+ doped area 520 and the p+ doped area 540, and a cathode includes the n+ doped area 550 and p+ doped area 590. It will be appreciated that although the anode and cathode each comprise two different doped areas or zones, i.e. n+ and p+, which are normally physically separated, they can be considered as a unitary element as the two differently doped areas or zones are electrically connected to one another at another level to form an LVT SCR structure. It is also be appreciated that according to a specific embodiment of the present disclosure, the two differently doped areas or zones comprising either the cathode or the anode can be partially or fully joined to form an abutted unitary element.

In some embodiments, a plurality of STI structures or zones can be formed in the p-type material or substrate and/or the n-well or region 510 for isolating the highly doped areas from the structure in which they are formed. In the case of p+ doped area 590, n+ doped area 550 and part of n+ doped area 530, STI structures or zones (not shown) are provided to isolate each of these areas and sub-areas from the p-type material or substrate. Similarly, for n+ doped area 520, p+ doped area 540 and part of n+ doped area 530, STI structures or zones (not shown) are provided to isolate each of these areas from the nwell or first region 510 in which they are formed.

Although the STI structures or zones are not shown in FIG. 5, it would be apparent to a person skilled in the art where they would be located to provide the isolation required for operation of the LVT SCR device 500 in accordance with the present disclosure. It is of particular interest to note that the un-doped zones in between and adjacent to the plurality of fins 570 are actually STI.

According to some embodiments, in operation, when an ESD event occurs such that a positive voltage is applied between the anode and the cathode, an avalanche zone 600 is created in the n+ doped area 530 adjacent the gate 580, wherein an avalanche breakdown occurs, thereby generating a current flow towards the gate 580 through n+ doped area 530. In this case, the current flows in the direction indicated by arrows 610 towards the gate 580 through n+ doped area 530 and fins 570 of the FinFET structure 560. It will be appreciated that, due to the presence of the plurality of fins 570 that are separated by STI regions, the active region of the n+ doped area 530 through which current flows is effectively reduced, thereby causing the current flow to be restricted. That is, because the current cannot flow through the STI regions, the current flowing through the n+ doped area 530 as indicated by the arrows 610 is forced to flow through the fins 570. In some embodiments, the fins 570 can be formed by recessing the adjacent substrate material and filling the recessed regions with an isolation dielectric, followed by a planarization process (e.g., chemical-mechanical polish)

such that the top surfaces of the fins 570 are substantially co-planar with the top surfaces of the STI regions. That is, the fins 570 do not protrude substantially above the main surface of the substrate according to these embodiments.

In the LVT SCR structure of the device shown in FIG. 5, a parasitic diode is formed by the n-well and p-type material or substrate. When an ESD event occurs which has the effect of applying a negative voltage between the anode and the cathode, the parasitic diode behaves as a simple diode to protect the circuit which is to be protected.

Although the n+ doped areas and p+ doped areas, defined by two zones 550/590 and 520/540 are shown to be separated from one another in both the p-type material or substrate and the n-well, it will be appreciated that these areas can either be spaced from one another as shown or about one another as the STI structures or zones provide the necessary isolation. As a result of the abutment of the doped areas, the parasitic resistance of the p-type material (or substrate) and the n-well can be reduced with a possible increase in trigger current.

In the illustrated embodiment described with respect to FIG. 5, the device 500 has a total device width of about 40 μm and a fin width of about 20 nm with a pitch of about 200 nm (or a spacing of about 180 nm) between fins. In FIG. 5, the fin width is indicated at 'A'; the pitch is indicated at 'B'; and the spacing is indicated at 'C'. The anode to cathode distance is about 840 nm. In addition, fin widths may be in the range of between about 7 nm and about 45 nm, preferably between about 10 nm and about 40 nm, most preferably between about 10 nm and about 30 nm. Pitches may be in the range of about 40 nm and about 200 nm, preferably between about 60 nm and about 200 nm, and most preferably between about 100 nm and about 200 nm. In another specific embodiment, the device 500 has a fin width of about 10 nm with a pitch of about 45 nm (or spacing of about 35 nm) between fins. As used herein to describe various feature sizes of the device 500, the term "about" is used to describe a feature size that can be smaller or larger compared to a target dimension within typical patterning error margins. In various implementations, the term "about" is used to describe a feature size that can be larger/smaller than a target size by as much as about +/−15%, by as much as about +/−10%, or by as much as about +/−5%. For example, a pitch that has a target value of "about 100 nm" can have a pitch between 85 nm and 115 nm, between 90 nm and 110 nm, or between 95 nm and 105 nm.

It will be appreciated that other fin widths and pitches can be implemented according to a particular application, and the values given above are not intended to be limiting. The width of the fins and the pitch between fins determine the number of fins present in the bulk FinFET structure in accordance with the overall device width. In the specific embodiment described with reference to FIG. 5, for an overall device width of 40 μm and a fin width of about 20 nm and a pitch of about 200 nm, the number of fins is 200.

Figure 6:
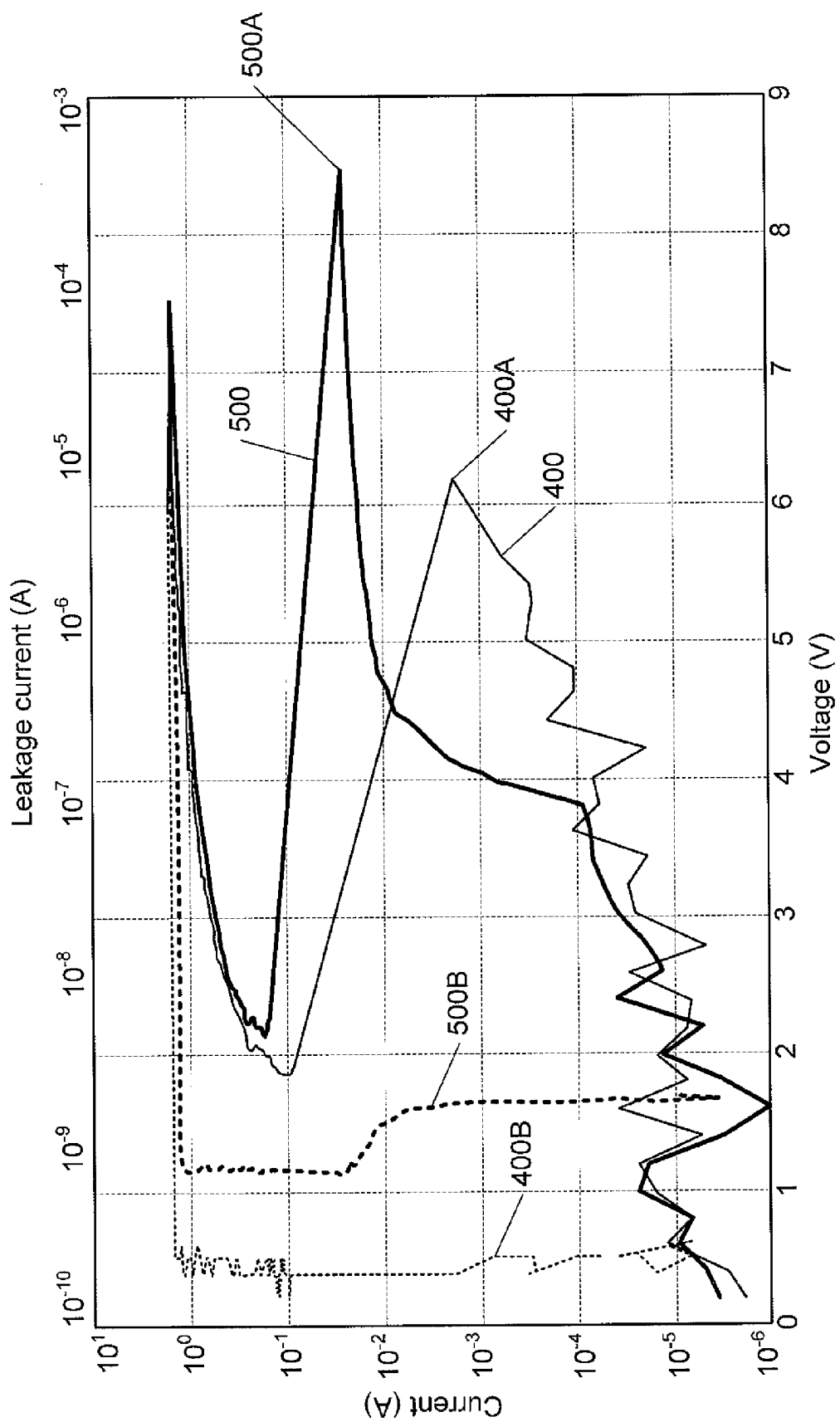
FIG. 6 illustrates current/voltage characteristics for the devices shown in FIGS. 4 and 5.

Test results comparing the trigger current for the LVT SCR device 400 of FIG. 4 and the LVT SCR device 500 of FIG. 5 are shown in FIG. 6. The results obtained for the device 400 of FIG. 4 is labelled as '400' and the results obtained for the device 500 of FIG. 5 is labelled as '500'. It can readily be seen that the trigger point for the device 400, labelled as '400A', corresponds to a trigger current of around 2 mA and trigger voltage of around 6.2V. Similarly, the trigger point for the device 500, labelled as '500A', corresponds to a trigger current of around 26 mA and a voltage of around 8.4V. Therefore, with the device 500, a trigger current over 10 times larger than that obtained for the device 400 can be obtained. A slight increase in holding voltage $V_H$ is also obtained. The results are summarized in Table 1 below.

TABLE 1

| Parameters | Device 400 | Device 500 | Difference |
| --- | --- | --- | --- |
| Trigger voltage | 6.2 V | 8.4 V | Increase of 2 V |
| Trigger current | 2 mA | 26 mA | 10 times increase |
| Holding voltage | 1.6 V | 1.8 V | Increase of 0.2 V |

The increase in both trigger current and trigger voltage are attributed to the presence of multiple fins and the STI in between the fin spaces particularly in the avalanche region 600. The presence of the fins has the effect of restraining the area defined by region 530, by having STI regions between the fins, so that parasitic bipolar, NPN and PNP structures cannot obtain sufficient current to become active. As a consequence, the LVT SCR device in accordance with the present disclosure cannot be fully triggered in low current conditions.

It is to be noted that although the trigger voltage has been increased in the embodiment of the present disclosure as shown in FIG. 6, it will readily be understood that the increase in trigger voltage is still within the ESD protection design window as indicated by region or zone 120 in FIG. 1.

The leakage current for the two devices is also shown in FIG. 6. The result for device 400 is labelled as '400B' and the result for device 500 is labelled as '500B'.

The types of materials and/or doping concentrations that can be used for the substrate, n-well, p+ and n+ regions are well known to a person skilled in the art and no specific materials have been described here. However, it will be appreciated that although the present disclosure has been described with reference to an embedded GGPMOS structure, it will be appreciated that GGPMOS structures could also be used with appropriate materials and/or doping concentrations. In the embodiment of the present disclosure, only standard processing steps are required and no additional doping processes or steps are necessary to implement the fin structure thereof. Preferably, all n+ doped areas are formed in the same process step and all p+ doped areas are formed in the same process step. Preferably, the fin structure is produced using double patterning technology, a photolithography process for defining the fins and the spacing between each fin.

Although the present disclosure has been described with reference to a specific embodiment, it will readily be understood that other embodiments of a LVT SCR with an embedded GGPMOS (or GGPMOS) structure are also possible.

What is claimed is:

1. An electrostatic discharge protection device, comprising:
    an anode and a cathode;
    a first region having a first doped area of a first dopant type, a second doped area of a second dopant type and a first part of a third doped area of the first dopant type, the first region being a well region of the first dopant type, a first node of the device being defined by the first and second doped areas;
    a second region comprising a fourth doped area of the first dopant type, a fifth doped area of the second dopant type, and a second part of the third doped area connecting the first part of the third doped area to the fourth doped area, a second node of the device being defined by the fourth and fifth doped areas,
    wherein one of the first and second nodes is configured as one of the anode and the cathode, and wherein the other of the first and second nodes is configured as the other of the anode and the cathode; and
    a grounded-gate metal oxide semiconductor structure having a gate formed over the second part of the third area and an avalanche zone in the locality of the gate, the first and second nodes being interposed by the gate extending in a first lateral direction, wherein the grounded-gate metal oxide semiconductor structure comprises a bulk fin-based transistor structure including, in the second part of the third doped area, a plurality of fin elements isolated from each other in the first lateral direction by a plurality of shallow trench isolation structures.

2. The electrostatic discharge protection device of claim 1, wherein each of the fin elements extend under the gate in a second lateral direction crossing the first lateral direction.

3. The electrostatic discharge protection device of claim 1, wherein the fin elements have a pitch in the first lateral direction between about 40 nm and about 200 nm.

4. The electrostatic discharge protection device of claim 1, wherein the fin elements have a pitch in the first lateral direction between about 60 nm and about 200 nm.

5. The electrostatic discharge protection device of claim 1, wherein each of the fin elements has a width in the first lateral direction between about 7 nm and about 45 nm.

6. The electrostatic discharge protection device of claim 1, wherein each of the fin elements has a width in the first lateral direction between about 10 nm and about 40 nm.

7. The electrostatic discharge protection device of claim 1, wherein each of the fin elements has a width in the first lateral direction between about 10 nm and about 20 nm.

8. The electrostatic discharge protection device of claim 1, wherein the grounded-gate metal oxide semiconductor structure comprises an n-channel metal oxide semiconductor structure.

9. An apparatus for protection against transient electrical events, comprising:
a p-type substrate;
an n-type well formed in the p-type substrate;
a first p+ region formed in the p-type substrate;
a second p+ region formed in the n-type well;
a first n+ region formed in the n-type well;
a metal oxide semiconductor (MOS) structure laterally interposed between the first and second p+ regions, the MOS structure comprising:
an n+ source region and an n+ drain region elongated in a first lateral direction, the n+ source region and the n+ drain region being interposed by a channel region having a plurality of fin-shaped channel strips, wherein each fin-shaped channel strip extends in a second lateral direction crossing the first direction to connect the n+ source and n+ drain regions while separating two dielectric isolation regions in the first lateral direction, such that the channel region comprises a plurality of fin-shaped channel strips and dielectric isolation regions that are alternating in the first lateral direction, and
a gate extending in the first lateral direction and formed over portions of the fin-shaped strips and the dielectric isolation regions.

10. The apparatus of claim 9, wherein the n+ drain region is interposed between the gate and the second p+ region and formed at a boundary region between the p-type substrate and the n-type well such that a portion of the n+ drain region is formed in the p-type substrate while a remaining portion of the n+ drain region is formed in the n-type well.

11. The apparatus of claim 10, wherein the n+ drain region and the second p+ region are substantially parallel to each other and co-extend in the first lateral direction.

12. The apparatus of claim 11, wherein the n+ drain region and the second p+ region have substantially the same lengths and co-terminate in the first lateral direction.

13. The apparatus of claim 10, wherein the n+ source region is interposed between the gate and the first p+ region, and the n+ source region and the first p+ region are substantially parallel to each other and co-extend in the first lateral direction.

14. The apparatus of claim 13, wherein the n+ source region and the first p+ region have substantially the same lengths and co-terminate in the first lateral direction.

* * * * *

UNITED STATES PATENT AND TRADEMARK OFFICE
CERTIFICATE OF CORRECTION

PATENT NO. : 9,087,849 B2  Page 1 of 1
APPLICATION NO. : 14/478817
DATED : July 21, 2015
INVENTOR(S) : Shih-Hung Chen et al.

It is certified that error appears in the above-identified patent and that said Letters Patent is hereby corrected as shown below:

In the specification,

In column 2 at line 63, Change "sub-20nm" to --sub-20 nm--.

In column 8 at line 39, Change "nwell" to --n-well--.

In column 10 at line 31 (approx.), Change "GGPMOS" to --GGNMOS--.

In column 10 at line 44, Change "GGPMOS" to --GGNMOS--.

Signed and Sealed this
Sixteenth Day of February, 2016

Michelle K. Lee
*Director of the United States Patent and Trademark Office*